(12) United States Patent
Li et al.

(10) Patent No.: US 9,806,006 B2
(45) Date of Patent: Oct. 31, 2017

(54) ETCH ISOLATION LPCC/QFN STRIP

(75) Inventors: Tung Lok Li, Hong Kong (CN); Kwok Cheung Tsang, Hong Kong (CN); Kin Pui Kwan, Hong Kong (CN)

(73) Assignee: UTAC HEADQUARTERS PTD. LTD., Singapore (SG)

( * ) Notice: Subject to any disclaimer, the term of this patent is extended or adjusted under 35 U.S.C. 154(b) by 577 days.

(21) Appl. No.: 11/916,242

(22) PCT Filed: Sep. 20, 2007
(Under 37 CFR 1.47)

(86) PCT No.: PCT/CN2007/002782
§ 371 (c)(1),
(2), (4) Date: Oct. 7, 2010

(87) PCT Pub. No.: WO2009/036604
PCT Pub. Date: Mar. 26, 2009

(65) Prior Publication Data
US 2011/0284495 A1    Nov. 24, 2011

(51) Int. Cl.
*H05K 13/00* (2006.01)
*H01L 23/495* (2006.01)
*H01L 21/48* (2006.01)
*H01L 21/56* (2006.01)
(Continued)

(52) U.S. Cl.
CPC .... *H01L 23/49548* (2013.01); *H01L 21/4832* (2013.01); *H01L 21/561* (2013.01); *H01L 23/49582* (2013.01); *H01L 24/97* (2013.01); *H01L 23/3107* (2013.01); *H01L 24/45* (2013.01); *H01L 24/48* (2013.01); *H01L 2224/32245* (2013.01); *H01L 2224/45144* (2013.01); *H01L 2224/48091* (2013.01); *H01L 2224/48247* (2013.01); *H01L 2224/48639* (2013.01); *H01L 2224/48655* (2013.01); *H01L 2224/73265* (2013.01); *H01L 2224/85439* (2013.01); *H01L 2224/85455* (2013.01); *H01L 2224/97* (2013.01); *H01L 2924/00014* (2013.01); *H01L 2924/014* (2013.01); *H01L 2924/01029* (2013.01); *H01L 2924/01033* (2013.01); *H01L 2924/01046* (2013.01); *H01L 2924/01047* (2013.01); *H01L 2924/01078* (2013.01); *H01L 2924/01079* (2013.01);
(Continued)

(58) Field of Classification Search
CPC .... H01L 21/4832; H01L 21/561; H01L 24/48
USPC .............................................. 216/14; 438/106
See application file for complete search history.

(56) References Cited

U.S. PATENT DOCUMENTS

| 6,451,627 | B1 | 9/2002 | Coffman |
| 6,773,961 | B1 | 8/2004 | Lee et al. |
| 6,812,552 | B2 | 11/2004 | Islam et al. |

(Continued)

OTHER PUBLICATIONS

International Search Report and Written Opinion, mailed Jul. 3, 2008, directed to corresponding International Application No. PCT/CN2007/002782. 12 pages.

*Primary Examiner* — Bo Fan
(74) *Attorney, Agent, or Firm* — Horizon IP Pte Ltd.

(57) ABSTRACT

Various structures and fabrication methods for leadless plastic chip carrier (QFN) packages which utilize carriers in strip format, wherein the leads (or terminals) are formed to be electrically isolated from one another within each unit and in which the units are formed to be electrically isolated from one another within the strip using chemical etching techniques.

20 Claims, 28 Drawing Sheets

(51) Int. Cl.
*H01L 23/00* (2006.01)
*H01L 23/31* (2006.01)
(52) U.S. Cl.
CPC ............... *H01L 2924/01082* (2013.01); *H01L 2924/181* (2013.01)

(56) References Cited

U.S. PATENT DOCUMENTS

| | | | | |
|---|---|---|---|---|
| 7,087,461 B2 * | 8/2006 | Park | .................... | H01L 21/561 257/E23.046 |
| 2005/0287709 A1 * | 12/2005 | Lee | ..................... | H01L 21/56 438/122 |

* cited by examiner

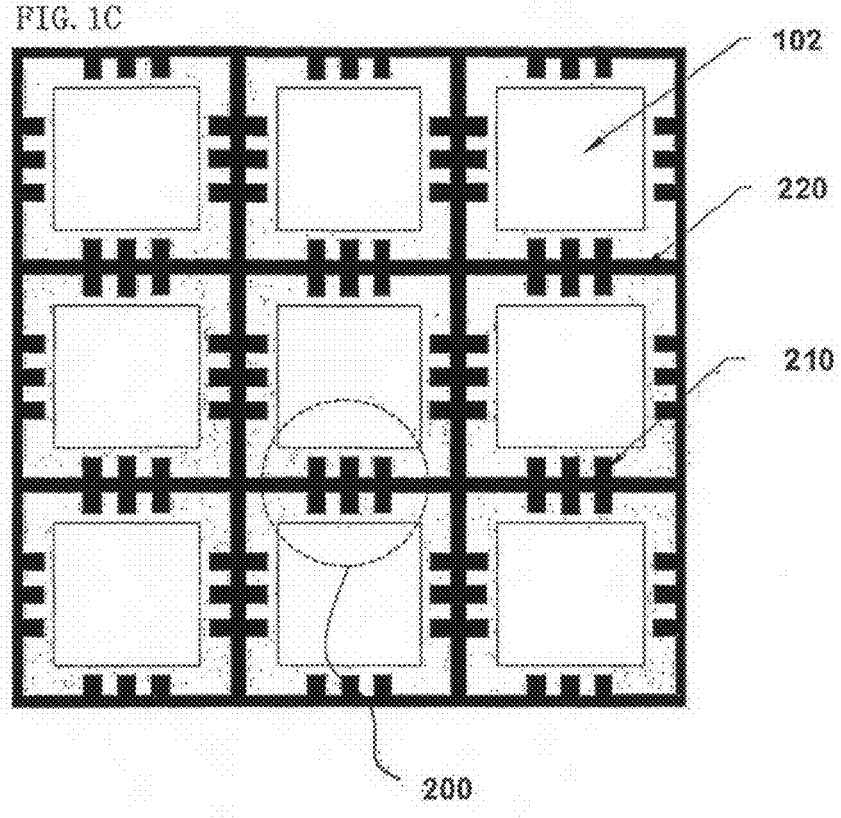

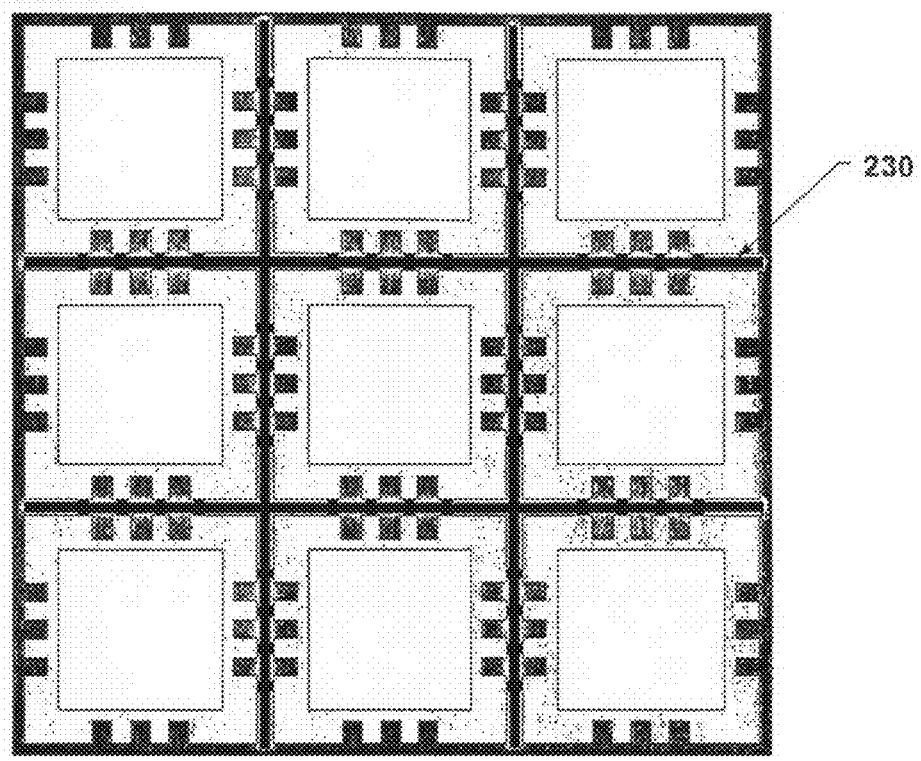

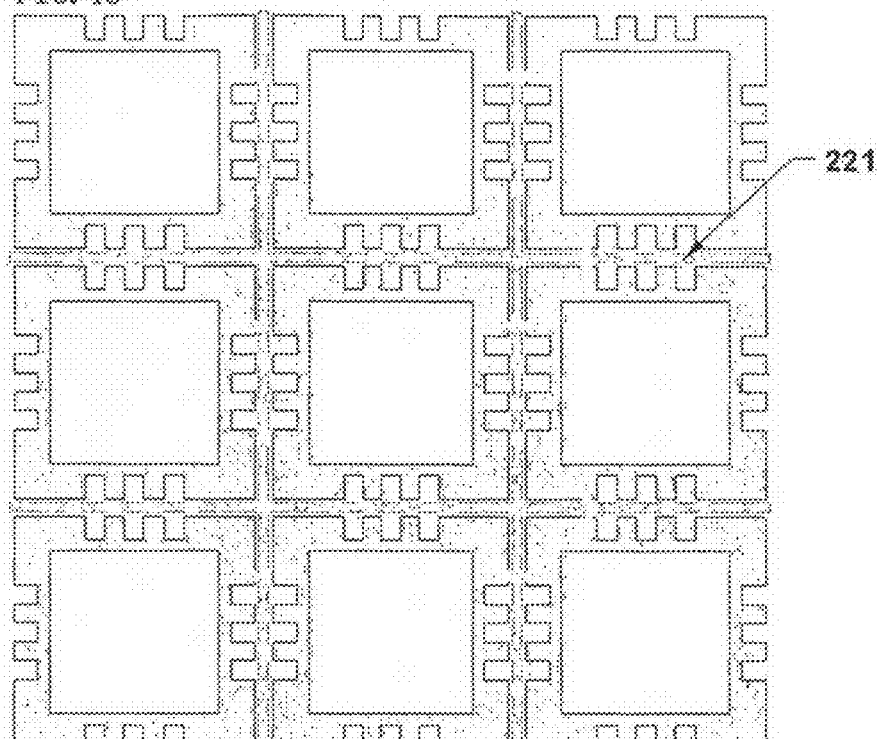

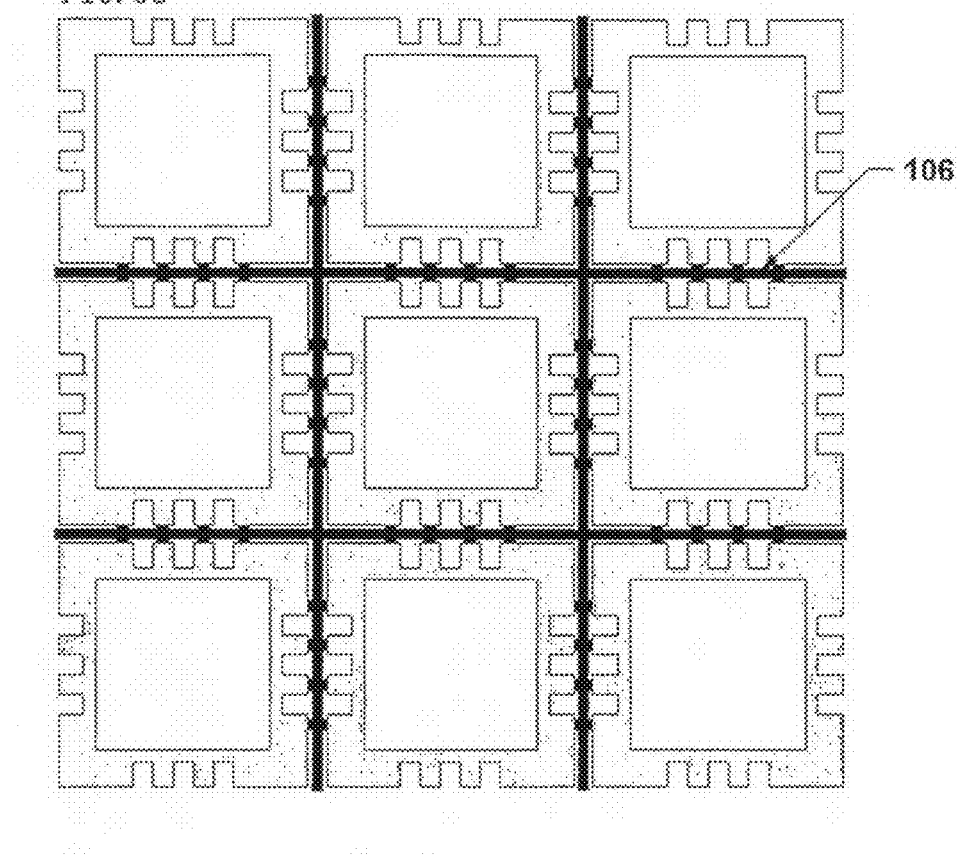

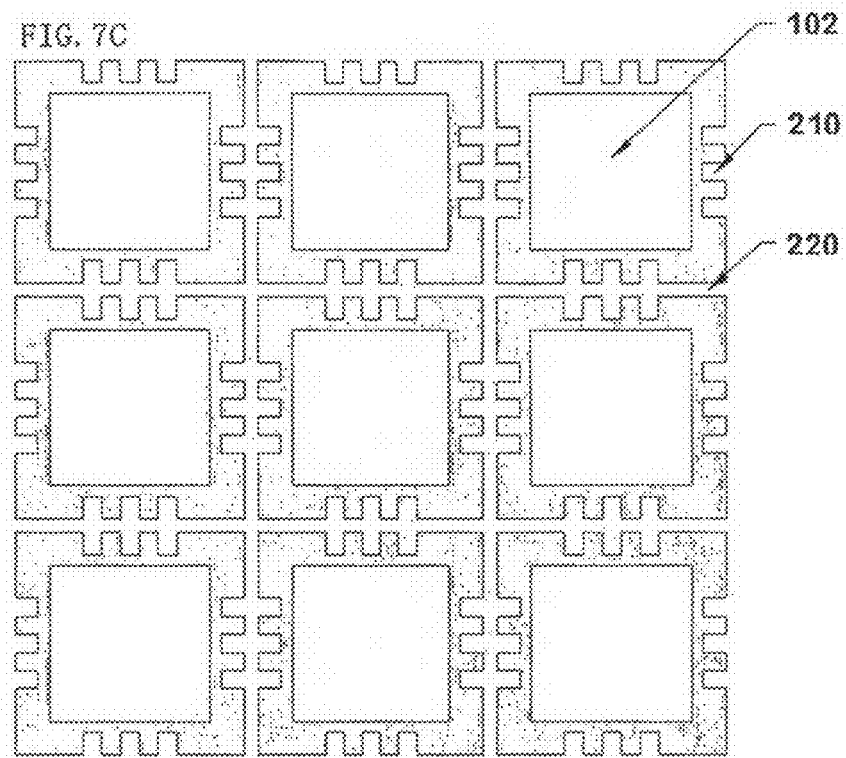

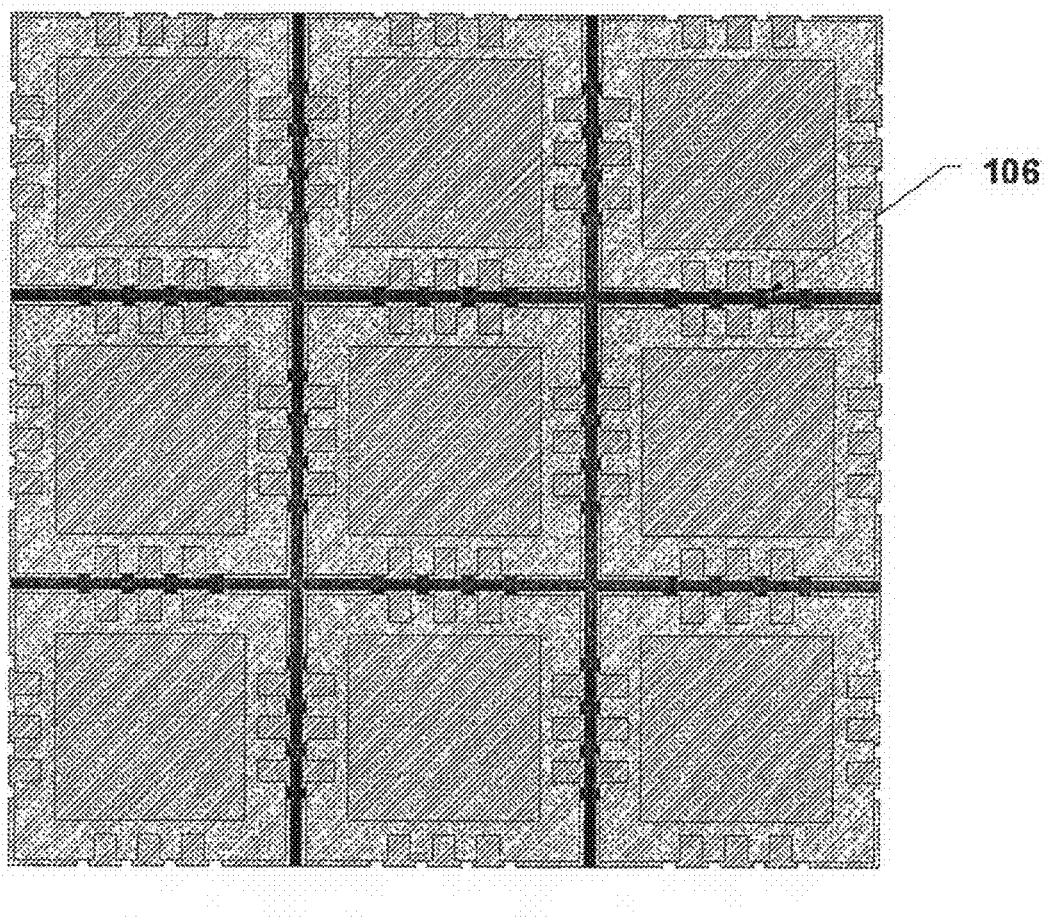

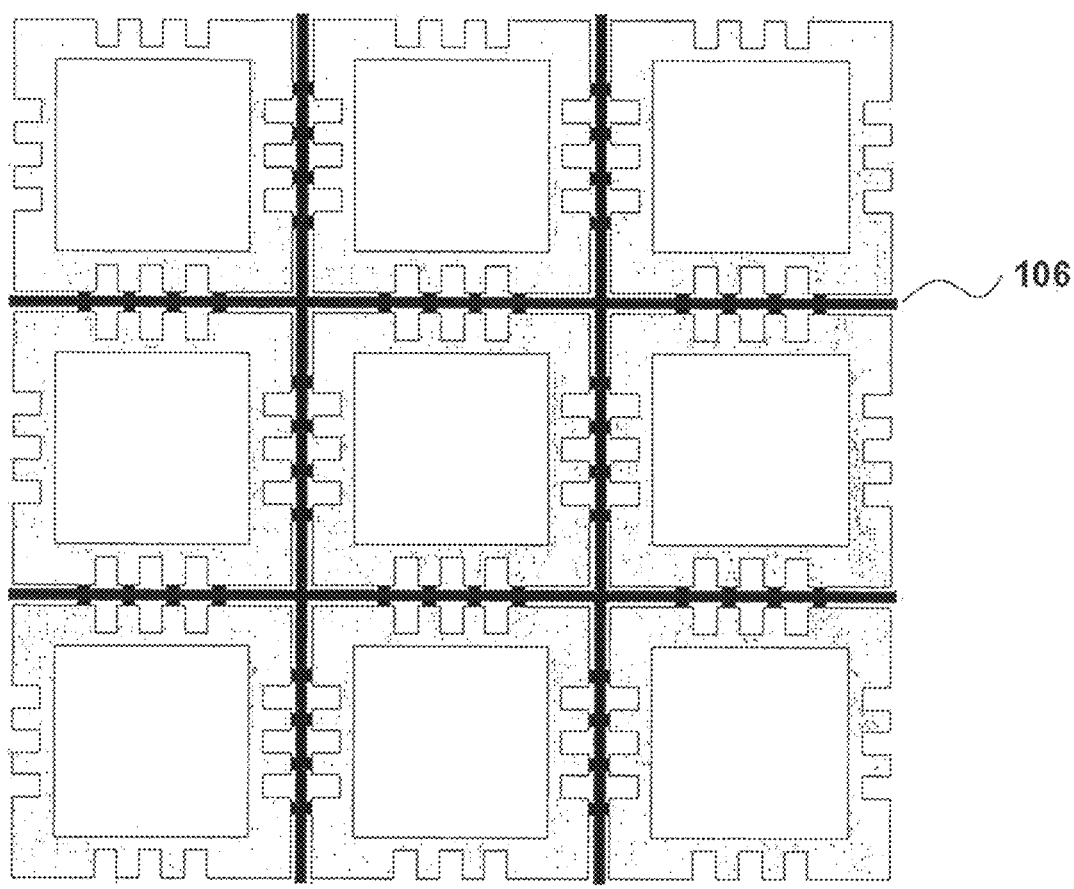

ETCH ISOLATION LPCC/QFN STRIP

CROSS-REFERENCE TO RELATED APPLICATION

This application is a National Stage application under 35 USC 371 of International Application No. PCT/CN2007/002782, filed Sep. 20, 2007, the entire contents of which are incorporated herein by reference.

BACKGROUND OF THE INVENTION

The raw leadframe material for leadless plastic chip carrier packages is generally presented in a strip format to facilitate the IC assembly process. Each strip can contain hundreds or thousands of individual Quad Flat Package No Leads (hereinafter, "QFN") units, depending on the QFN body size. While in strip format, all of the leads (or terminals) of each individual unit, as well as all the units in that strip, are connected together by a segment of the leadframe metal called the dambar. This connection has been necessary to provide the mechanical rigidity required during fabrication and assembly, as well as to provide electrical connection during external lead finish using electrodeposition methods.

In order to perform final electrical testing of the QFN units, it is necessary to electrically isolate the leads. Known methods of isolation include:

Mechanical removal of the dambar using a circular saw that cuts approximately halfway into the plastic package, leaving the QFN units in the strip format for subsequent processing. This is a slow operation, and creates a structurally weak array of IC components in the finished leadframe strip, which may lead to mechanical failures during testing.

Mounting of a fully assembled and molded leadframe strip on an adhesive tape surface, followed by mechanical isolation (or singulation) of the individual units by saw-cutting through the full leadframe strip thickness, and leaving the singulated units on the sticky tape/metal ring assembly used during singulation for subsequent processing. The resultant structure is bulky and the tape tends to expand, thereby affecting the positional accuracy of each individual unit.

Mechanical isolation (or singulation) of the individual units in the strip and transferring the units to various shipping containers, such as tubes, reels of cavity tape, trays or canisters. The units are subsequently tested by taking them out of these containers and transporting them individually to the test equipment (one unit at a time) using various handling methods such as gravity feed, pick and place or vibratory bowl feeders. This is often a complex, expensive and time-consuming process.

In another form of the QFN, individual units are molded on a leadframe strip, leaving leadframe metal segments exposed between individual units in the strip. Units are then electrically isolated by severing the exposed metal segments that electrically connect the leads and units in the strip. This is generally accomplished by use of a precision mechanical punch tool. This requires unique punch tooling for each device body size and lead spacing, increasing process cost. The punch operation also increases risk of delamination between metal leadframe segments and the molding compound.

BRIEF SUMMARY OF THE INVENTION

Various structures and fabrication methods for leadless plastic chip carrier (QFN) packages are disclosed herein. Preferred embodiments of the invention may utilize QFN's in strip format, wherein the leads (or terminals) are formed to be electrically isolated from one another within each unit and in which the units are formed to be electrically isolated from one another within the strip. The electrical isolation is preferably achieved using chemical etching techniques. The assembled strip allows final electrical testing to be done in strip format, which saves on both the indexing and testing times.

According to one embodiment of the invention, a method for forming a plurality of leadless chip carriers may include; forming a carrier strip having a plurality of die attach pads, a plurality of dice, respectively mounted to the die attach pads, a leadframe, wherein the leadframe at least partially encircles the die attach pads, interconnects, such as gold wires, to connect the die to respective terminals on the leadframe, and a molding, wherein the molding encapsulates an upper surface and edges of the die attach pads, the dice and all other leadframe elements associated with the QFN units, and the gold wires; forming an etch mask on a portion of a bottom surface of the leadframe; forming a plating on a bottom surface of the die attach pads, and a portion of the bottom surface of the leadframe where an etch mask is not formed; removing at least a portion of the etch mask from the bottom surface of the leadframe to expose a portion of the bottom side of the leadframe; and etching the leadframe such that a portion of a bottom surface of the molding is exposed in locations previously covered by the portions of the leadframe that were etched away. The leadframe may be made of alloys of copper, to include, but not limited to, oxygen-free high-conductivity copper alloys, and other metals such as Alloy 42, KOVAR, and any other metal that may be used in this application. The internal leadframe plating may be made of at least one of Ag (silver), layered NiAu (Nickel-Gold), layered NiPdAu (Nickel-Palladium-Gold), or layered NiPd (Nickel-Palladium). The external plating may be made of at least one of electrodeposited pure Sn (tin), electroplated tin with additives, layered Ni—Pd—Au, layered Ni—Pd, or Sn/Pb (tin/lead) of various ratios.

According to another embodiment of the invention, a method for forming a plurality of leadless chip carriers may include; forming a carrier strip having a plurality of die attach pads, a plurality of dice, respectively mounted to the die attach pads, a leadframe, wherein the leadframe at least partially encircles the die attach pads, interconnects, such as gold wires, to connect the die to respective terminals on the leadframe, and a molding, wherein the molding encapsulates an upper surface and edges of the die attach pads, the dice, and all other leadframe elements associated with the QFN units, and, the gold wires; forming a plating on a bottom surface of the die attach pads, and all exposed areas of the leadframe; forming an etch mask on a portion of a bottom surface of the leadframe and on portions of the molding such that the etch mask is not formed at dambar regions of the leadframe; removing the plating at the dambar regions of the leadframe; etching the leadframe at the dambar regions of the leadframe such that a portion of a bottom surface of the molding is exposed in locations previously covered by the dambar region portions of the leadframe that were etched away; and removing the etch mask. The leadframe may be made of alloys of copper, to include, but not limited to, oxygen-free high-conductivity copper alloys, and other metals such as Alloy 42, KOVAR, and any other metal that may be used in this application. The internal leadframe plating may be made of at least one of Ag (silver), layered NiAu (Nickel-Gold), layered NiPdAu (Nickel-Palladium-Gold), or layered NiPd (Nickel-Palladium). The external plating may be made of at least one of electrodeposited pure Sn (tin), electroplated tin with additives, layered Ni—Pd—Au, layered Ni—Pd, or Sn/Pb (tin/lead) of various ratios.

According to yet another embodiment of the invention, a method for forming a plurality of leadless chip carriers may include; forming a carrier strip having a plurality of die attach pads, a plurality of dice, respectively mounted to the die attach pads, a leadframe, wherein the leadframe at least partially encircles the die attach pads and the leadframe is pre-plated with a protective finish; interconnects, such as gold wires, to connect the die to respective terminals on the leadframe, and a molding, wherein the molding encapsulates an upper surface and edges of the die attach pads, the dice, and all other leadframe elements associated with the QFN units, and the gold wires; forming an etch mask on a portion of a bottom surface of the leadframe and on portions of the molding such that the etch mask is not formed at dambar regions of the leadframe; removing the pre-plated finish at the dambar regions of the leadframe; etching the leadframe at the dambar regions of the leadframe such that a portion of a bottom surface of the molding is exposed in locations previously covered by the dambar region portions of the leadframe that were etched away, and removing the etch mask. The leadframe may be made of alloys of copper, to include, but not limited to, oxygen-free high-conductivity copper alloys, and other metals such as Alloy 42, KOVAR, and any other metal that may be used in this application. The internal leadframe plating may be made of at least one of Ag (silver), layered NiAu (Nickel-Gold), layered NiPdAu (Nickel-Palladium-Gold), or layered NiPd (Nickel-Palladium). The external plating may be made of at least one of electrodeposited pure Sn (tin), electroplated tin with additives, layered Ni—Pd—Au, layered Ni—Pd, or Sn/Pb (tin/lead) of various ratios.

According to various embodiments of the invention, a method for forming a plurality of leadless chip carriers may include, forming a plurality of QFN devices using a single leadframe, and electrically isolating the QFN device by selectively etching the leadframe.

According to various embodiments of the invention, the plurality of QFN devices is formed as a carrier strip.

According to various embodiments of the invention, the electrical isolation of the QFN devices is performed while the QFN devices are in the carrier strip.

According to various embodiments of the invention the method may further include, functional (electrical) testing of the QFN devices being performed while the QFN devices are in the carrier strip. After functional (electrical) testing, the QFN devices are singulated from the strip using saw-singulation techniques known to those skilled in the art.

BRIEF DESCRIPTION OF THE DRAWINGS

FIGS. 1A, 1B and 1C depict a leadless plastic chip carrier strip according to an exemplary embodiment of the invention.

FIGS. 2A, 2B and 2C depict a leadless plastic chip carrier strip, wherein an etch resist is applied onto the dambar regions, according to an exemplary embodiment of the invention.

FIGS. 4A, 4B and 4C depict a leadless plastic chip carrier strip, wherein the etch resist is removed from the dambar regions, according to an exemplary embodiment of the invention.

FIGS. 5A, 5B and 5C depict a leadless plastic chip carrier strip, wherein the unplated area of the dambar regions is etched away, according to an exemplary embodiment of the invention.

FIGS. 7A, 7B and 7C depict a leadless plastic chip carrier strip, wherein a surface of the carrier strip is plated, according to an exemplary embodiment of the invention.

FIGS. 10A, 10B and 10C depict a leadless plastic chip carrier strip, wherein the exposed material of the dambar regions is etched away, according to an exemplary embodiment of the invention.

FIGS. 11A, 11B and 11C depict a leadless plastic chip carrier strip, wherein the remaining etch resist on the surface of the carrier strip is removed, according to an exemplary embodiment of the invention.

DETAILED DESCRIPTION OF THE INVENTION

In the following description of preferred embodiments, reference is made to the accompanying drawings, which form a part hereof. It is to be understood that other embodiments may be used and structural changes may be made without departing from the scope of the preferred embodiments. In addition, the following description includes examples that include various materials used for plating, finishing and masking. It is understood that other materials may be substituted for these materials without deviating from the scope of the preferred embodiments.

According to various embodiments of the invention, the structure of a leadless plastic chip carrier (QFN) package and fabrication methods thereof are disclosed. According to a preferred embodiment, the carriers are formed in a strip format, wherein the leads (which may be terminals) are electrically isolated from one another within each unit. Furthermore, the units may be electrically isolated from one another within the strip. The electrical isolation may be achieved using chemical etching techniques as described below. By forming a strip in this manner, final electrical testing may be performed on the strip prior to singulation, thereby reducing indexing and testing times.

FIGS. 1A through 6 depict a first exemplary method and/or process for forming leadless plastic chip carriers as well as a structure thereof. The figures depict various views of a leadless carrier strip during various stages of formation as indicated.

Figure 1A:
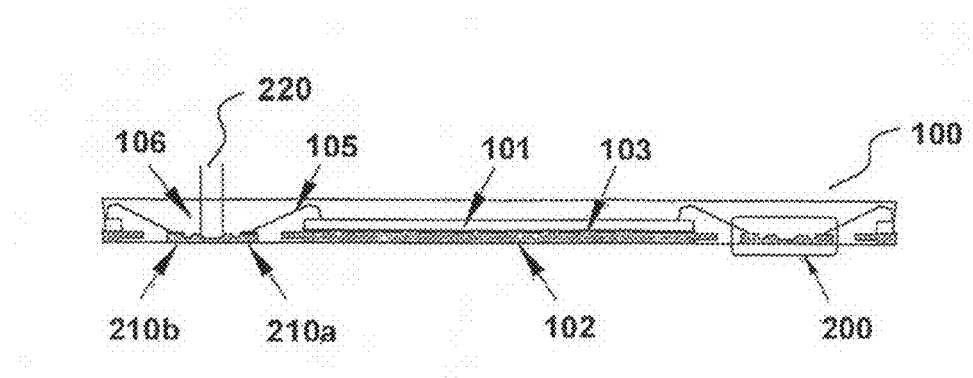

FIG. 1A depicts a portion of a side view of a leadless chip carrier strip 100. As shown in FIG. 1A, a die 101 may be attached to a die attach pad 102 using a die attach material 103. The die attach material may comprise soft solder, epoxy or polyimide. The latter two materials may be in fluid or film form and may be mixed with metal fillers, such as silver, to enhance its thermal and electrical characteristics. Adjacent to the die attach pad 102, are lead regions 200 which may comprise multiple lead pads 210a, 210b and a dambar region 220. The lead pads 210a, 210b may be electrically connected to the die 101 using contacts 105 such as metal wires. The contacts 105 are preferably gold wires. According to alternate embodiments, the carrier 100 may also be formed to have a ground ring as is known in the art. An upper surface of the carrier strip may be enclosed in a molding material 106 as shown. The molding material 106 may be made of epoxy, silicone, thermoplastics or a combination thereof.

It is noted that FIG. 1A shows only one complete die 101 and die attach pad 102. However, additional dice 101 and pads 102 are depicted on either side of those shown, indicating that the depicted die 101 and pad 102 are part of a carrier strip. The lead regions 200 are depicted between die 101 and pad 102 assemblies because they are to be formed such that a portion of each lead region 200 is to be used by a different carrier as detailed below.

Figure 1B:
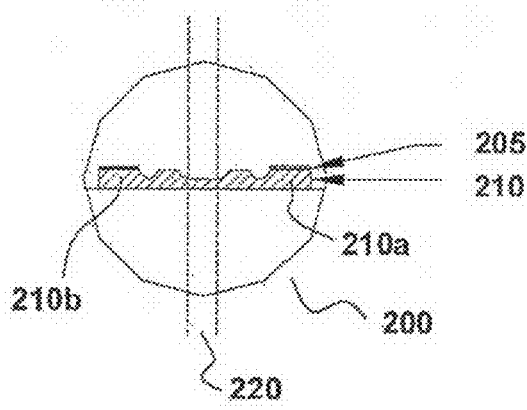

FIG. 1B depicts one of the lead regions 200 of FIG. 1A. As shown in FIG. 1B, the lead region may comprise a first lead pad 210a, a second lead pad 210b and a dambar region 220. Optionally, a bondable metallization 205 may be formed on the lead pads 210a, 210b. The bondable metallization may comprise a material such as Ag, NiAu and/or NiPd. The lead pads 210a, 210b and the dambar region 220 may be made of a metal such as copper or alloys of copper.

FIG. 1C depicts a bottom up view of an exemplary carrier strip. Although the depicted strip is shown as a 3×3 matrix, it is understood that the dimensions of the strip are not limited to such a format. Various embodiments of the invention may use alternate configurations, for example 5×5 and 7×7. FIG. 1C shows a plurality of die attach pads 102 and lead regions 200. The lead regions 200 are shown having dambar regions 220 and lead pads 210. FIG. 1C depicts a bottom surface of the carrier strip, wherein the bottom surface is exposed (i.e. not covered by the molding 106).

Figure 2A:
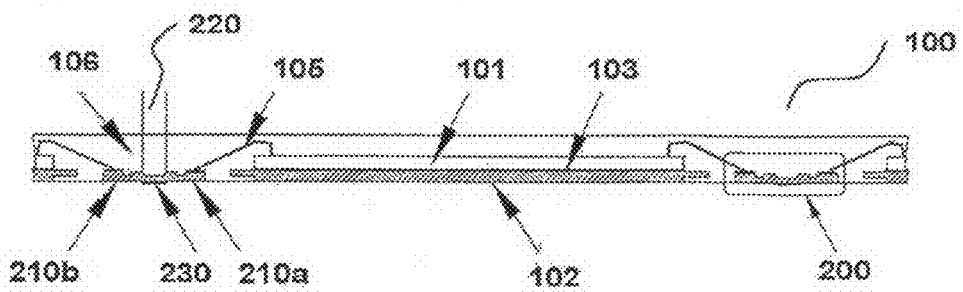
Figure 2B:
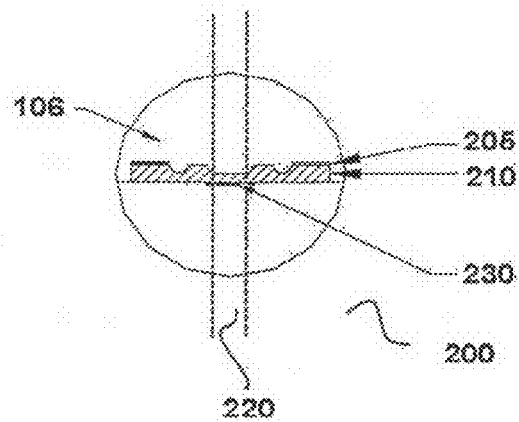

FIGS. 2A, 2B and 2C depict a leadless plastic chip carrier strip, wherein an etch resist is applied onto the dambar regions, according to an exemplary embodiment of the invention. According to a preferred embodiment of the invention, an etch mask 230 is applied to the dambar regions 220 of the carrier strip. It is understood that the etch mask may be made of photosensitive material (photoresist) and may be applied either wet, through screen printing, or laminated as a dry film. FIG. 2b shows an expanded view of a lead region 200.

FIG. 2C shows a bottom view of an exemplary carrier strip after the etch mask 230 is applied. As shown in FIG. 2C, the etch mask 230 may be formed over the dambar regions 220.

Figure 3A:
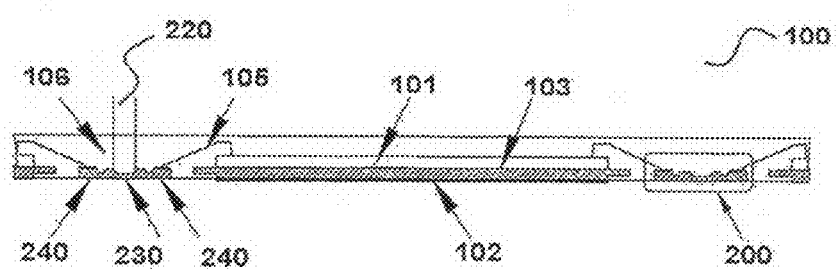
FIGS. 3A, 3B and 3C depict a leadless plastic chip carrier strip, wherein a portion of the surface of the carrier strip is plated, according to an exemplary embodiment of the invention.
Figure 3B:
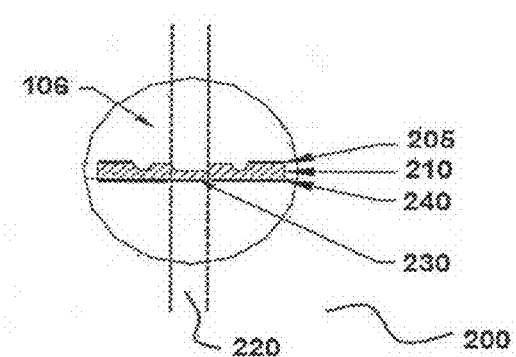
Figure 3C:
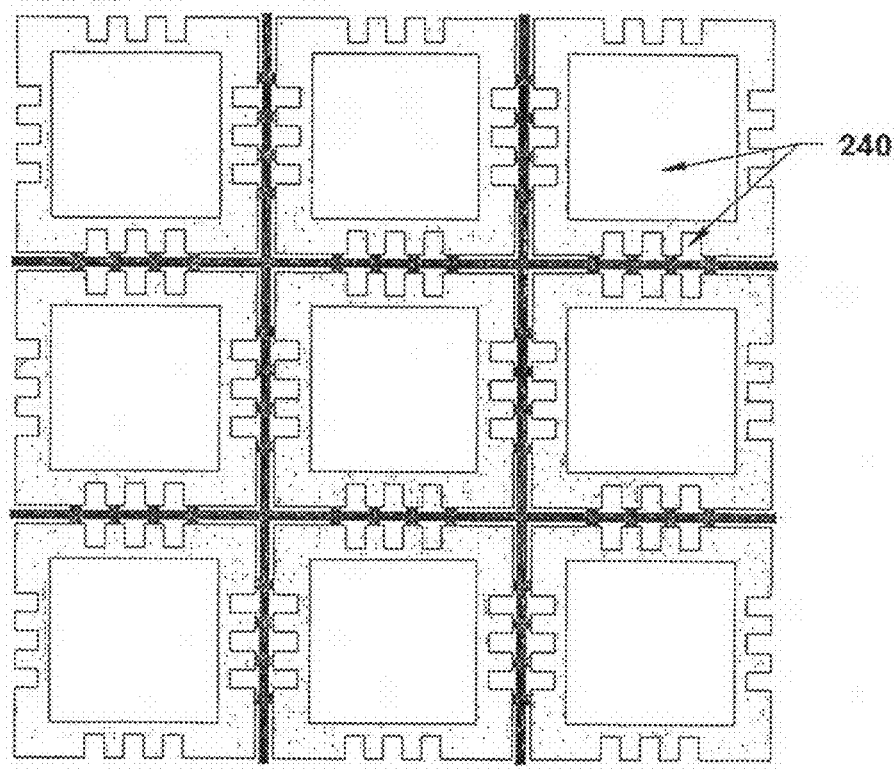

FIGS. 3A, 3B and 3C depict a leadless plastic chip carrier strip, wherein a portion of the surface of the carrier strip is plated, according to an exemplary embodiment of the invention. After the etch mask 230 is applied, a plating 240 may be applied to the un-masked portion of the bottom surface. The plating 240 may cover all or a portion of the un-masked surface. According to a preferred embodiment of the invention, the plating 240 may comprise tin or a tin lead material. Furthermore, the plating may be applied using electrolytic plating techniques known to those skilled in the art.

Figure 4A:
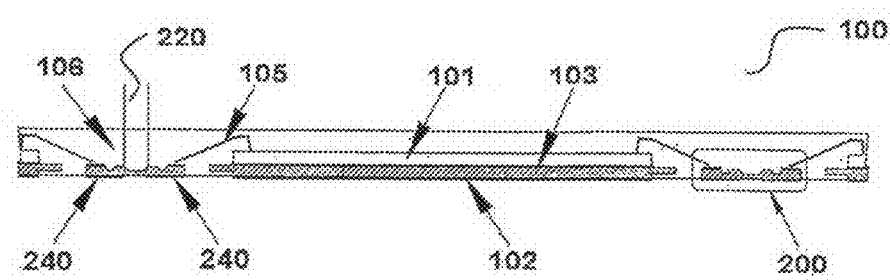
Figure 4B:
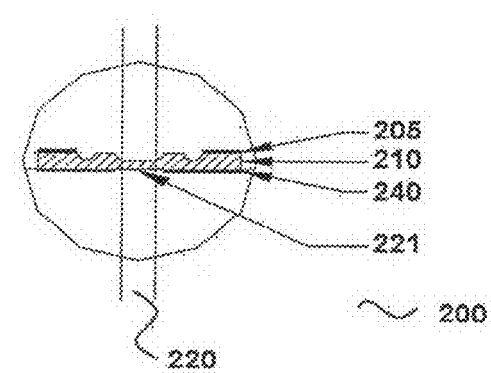

FIGS. 4A, 4B and 4C depict a leadless plastic chip carrier strip, wherein the etch resist is removed from the dambar regions, according to an exemplary embodiment of the invention. As depicted in FIGS. 4A, 4B and 4C, the etch mask 230 may then be removed from the carrier strip, thereby exposing a bottom surface 221 of the dambar region 220. The etch mask 230 may be removed using a variety of known techniques such as dipping or high-pressure spray.

According to a preferred embodiment of the invention, as shown in FIG. 4C, the base copper 221 of the dambar region 220 of the bottom surface of the carrier strip is now exposed while the remainder of the bottom surface is preferably plated with the plating 240.

Figure 5A:
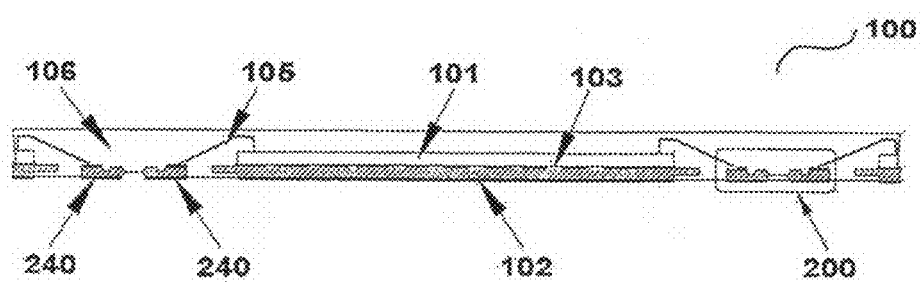
Figure 5B:
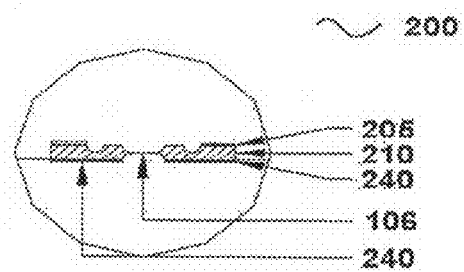

FIGS. 5A, 5B and 5C depict a leadless plastic chip carrier strip, wherein the unplated areas 221 of the dambar regions 220 are etched away, using the plating 240 as the etch resist material, according to an exemplary embodiment of the invention. Once the unplated areas 221 of the dambar regions 220 of the bottom surface of the carrier strip are exposed, the dambar region 220 may be etched to remove the lead material from the dambar region as shown in FIGS. 5A, 5B and 5C. As depicted in FIG. 5B, the lead material is preferably etched away such that the molding 106 is exposed. By thus etching away the lead material in the dambar regions, the lead pads 210a, 210b are electrically isolated. Furthermore, as depicted in FIG. 5C, the individual carriers are isolated from one another while remaining part of the carrier strip, thus allowing the carriers to be tested while still in strip form.

Figure 6:
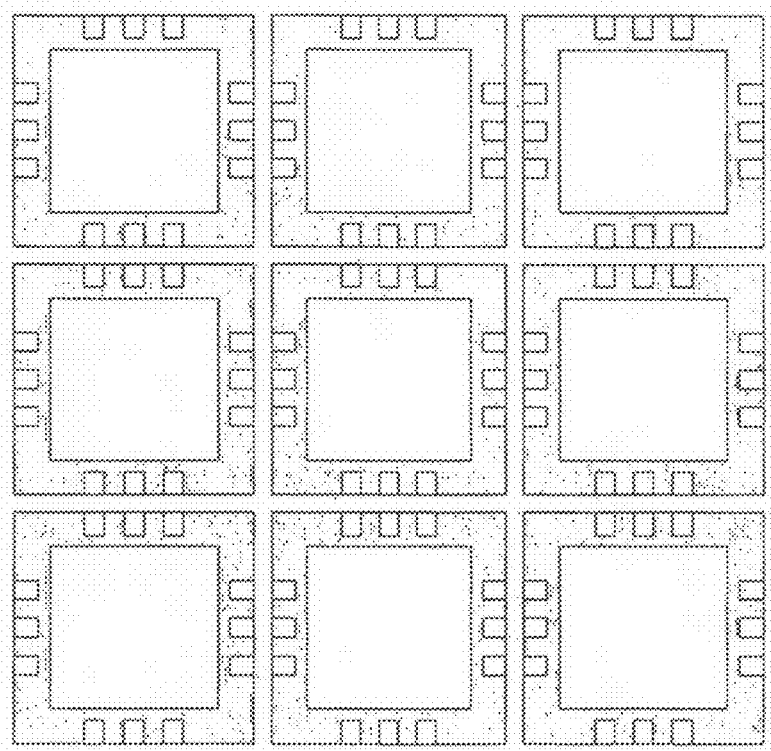
FIG. 6 depicts a plurality of leadless chip carriers following saw singulation according to an exemplary embodiment of the invention.

FIG. 6 depicts a plurality of leadless chip carriers following saw singulation according to an exemplary embodiment of the invention. Following the etching of the lead material in the dambar regions 220, and preferably following testing, the individual chip carriers may be separated from one another using saw singulation or a similar process.

FIGS. 7A through 12 depict a second preferred embodiment of the invention in which a bottom surface of the leadframe is plated after the molding 106 is applied.

Figure 7A:
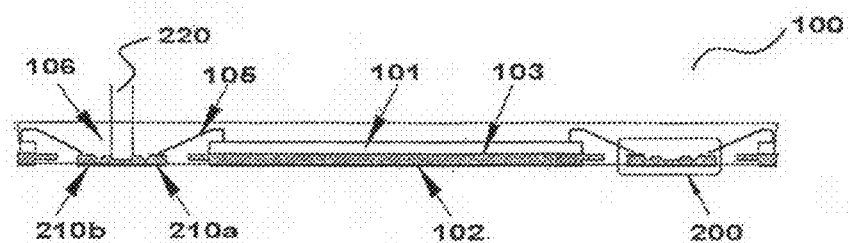
Figure 7B:
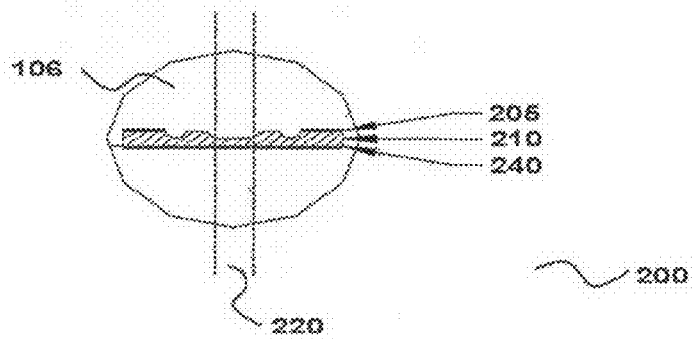

FIGS. 7A, 7B and 7C depict a leadless plastic chip carrier strip, wherein a surface of the carrier strip is plated, according to an exemplary embodiment of the invention. According to the second preferred embodiment, a plating 240 is applied to the metallized bottom surface (preferably the entire bottom surface) of the leadframe, including the die attach pad 102, the lead pads 210a, 210b and the dambar regions 220. Plating of the entire metallized bottom surface is easily accomplished using electrolytic plating techniques, since the metallized areas are all electrically connected together at this point.

Figure 8A:
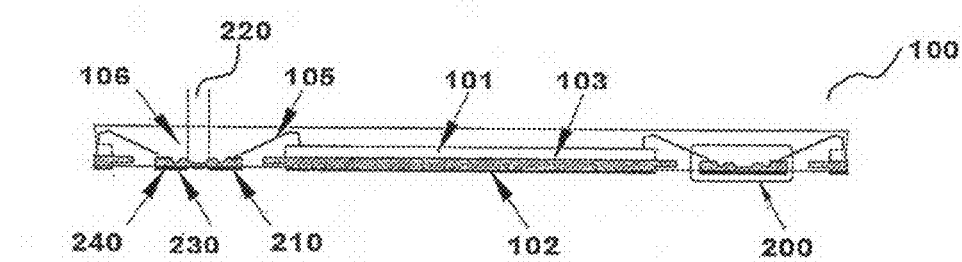
FIGS. 8A, 8B and 8C depict a leadless plastic chip carrier strip, wherein an etch resist is applied onto the plated surface of the strip except in the dambar regions, according to an exemplary embodiment of the invention.
Figure 8B:
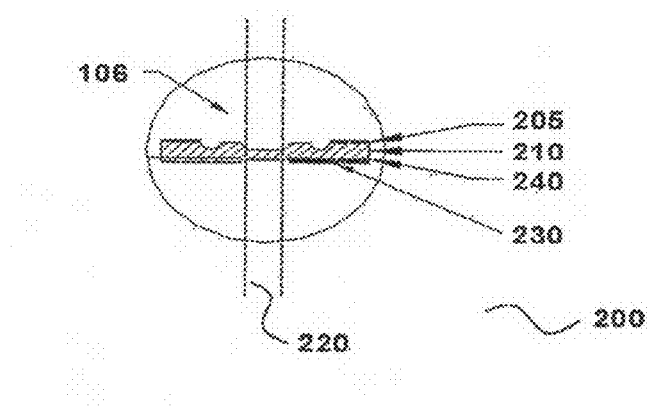
Figure 8C:
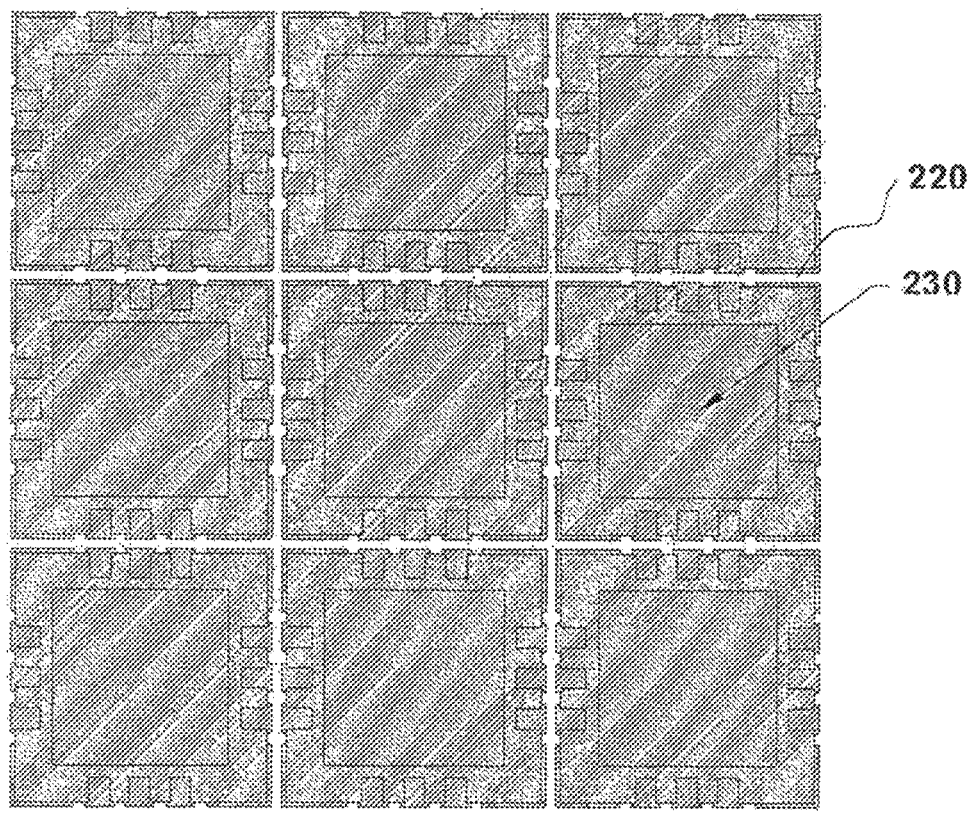

FIGS. 8A, 8B and 8C depict a leadless plastic chip carrier strip, wherein an etch resist is applied onto the plated surface of the strip except in the dambar regions, according to an exemplary embodiment of the invention. Following the application of the plating 240, an etch resist mask 230 may be applied to the bottom surface of the carrier strip. The application of the etch resist mask 230 is done using the same techniques as in the previous embodiment of the invention. As depicted in FIG. 8C, the etch mask 230 is preferably applied to the entire bottom surface of the carrier strip except on the dambar regions 220.

Figure 9A:
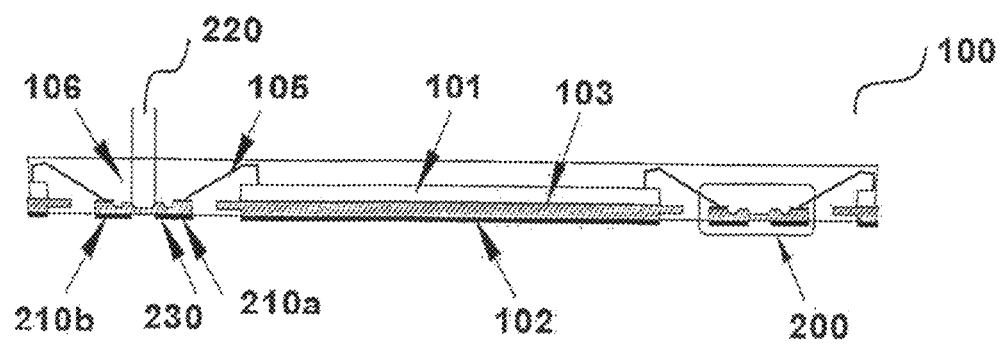
FIGS. 9A, 9B and 9C depict a leadless plastic chip carrier strip, wherein the plating is etched from the dambar regions, according to an exemplary embodiment of the invention.
Figure 9B:
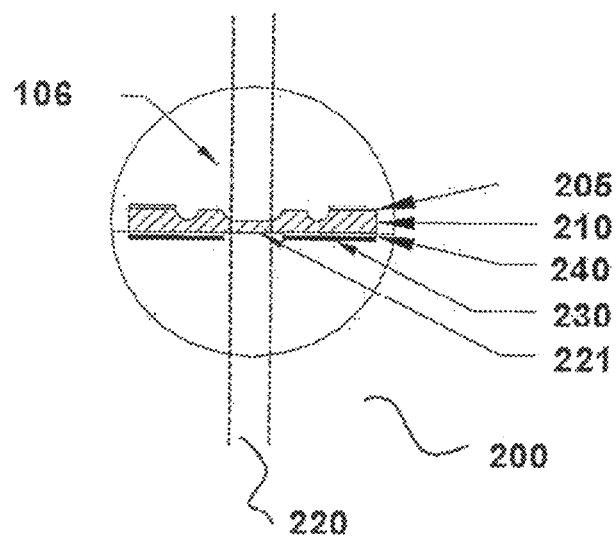
Figure 9C:
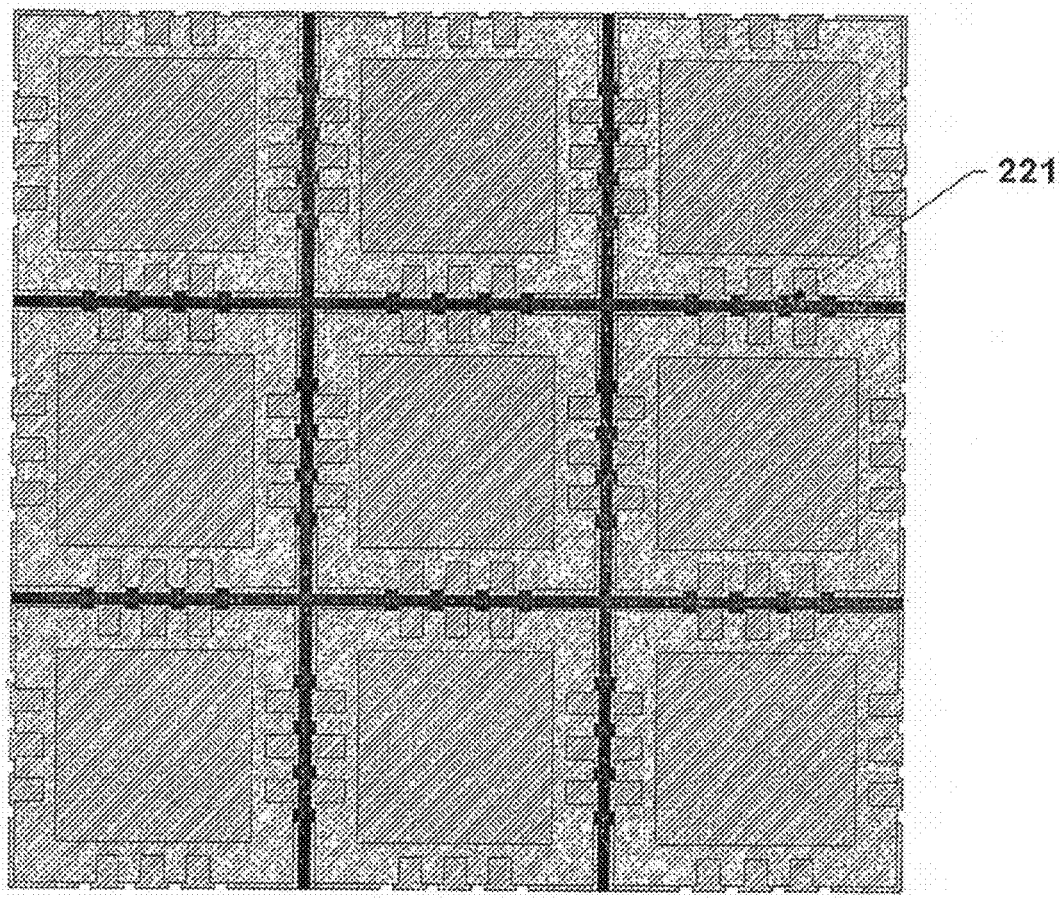

FIGS. 9A, 9B and 9C depict a leadless plastic chip carrier strip, wherein the plating is etched from the dambar regions, according to an exemplary embodiment of the invention. Following the application of the etch mask 230, the plating 240 is preferably removed from the dambar regions 220, thereby exposing the bottom surface 221 of the dambar regions 220. The plating 240 may be removed using known techniques, such as dipping or high-pressure spray.

Figure 10A:
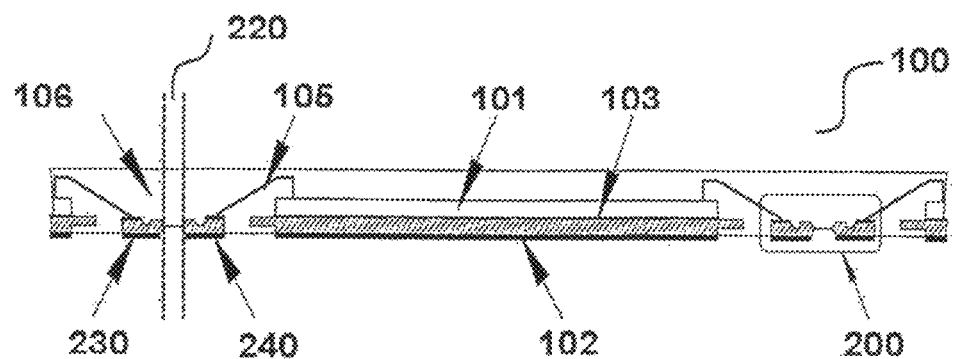
Figure 10B:
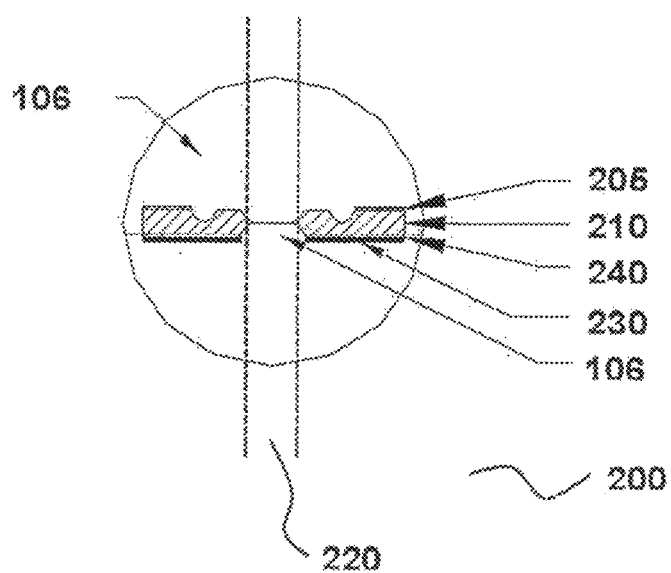

FIGS. 10A, 10B and 10C depict a leadless plastic chip carrier strip, wherein the exposed material of the dambar regions is etched away, according to an exemplary embodiment of the invention. Once the bottom surface 221 of the dambar regions 220 is exposed, after the removal of plating 240, the lead material of the dambar regions may then be removed using a technique such as etching, as shown in FIG. 10B. Again, the lead material in the dambar regions 220 is sufficiently removed such that the molding material 106 is exposed, thereby electrically isolating the lead pads 210a, 210b and the individual leadless chip carriers.

Figure 11A:
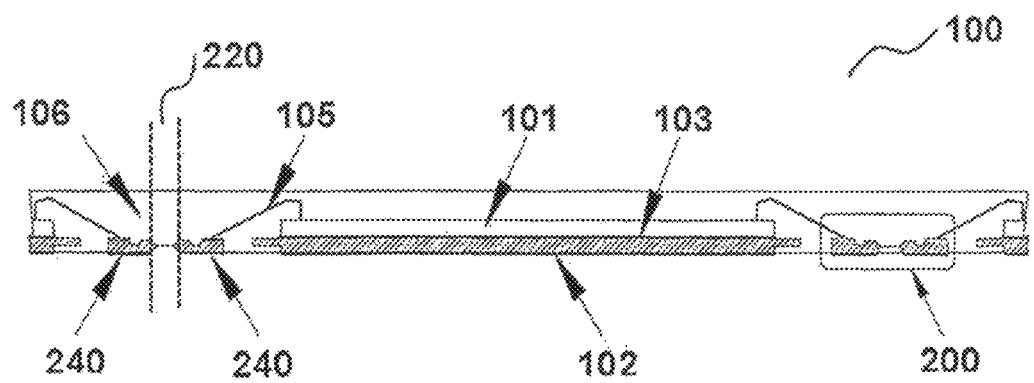
Figure 11B:
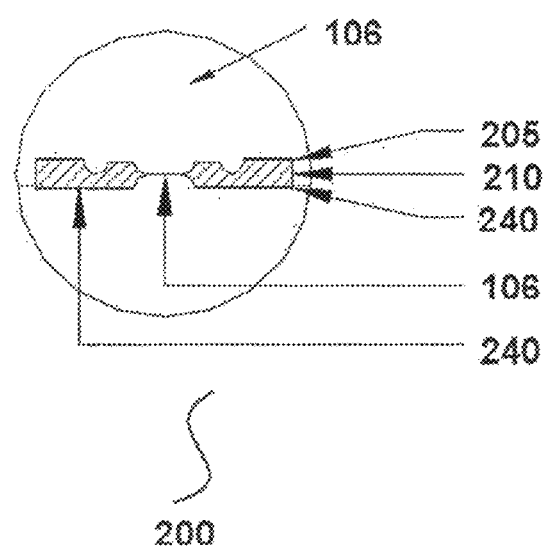

FIGS. 11A, 11B and 11C depict a leadless plastic chip carrier strip, wherein the remaining etch mask on the surface of the carrier strip is removed, according to an exemplary embodiment of the invention. Following the removal of the lead material 221 in the dambar regions 220, the etch mask 230 is preferably removed from the carrier strip such that the remaining plating 240 is exposed.

Figure 12:
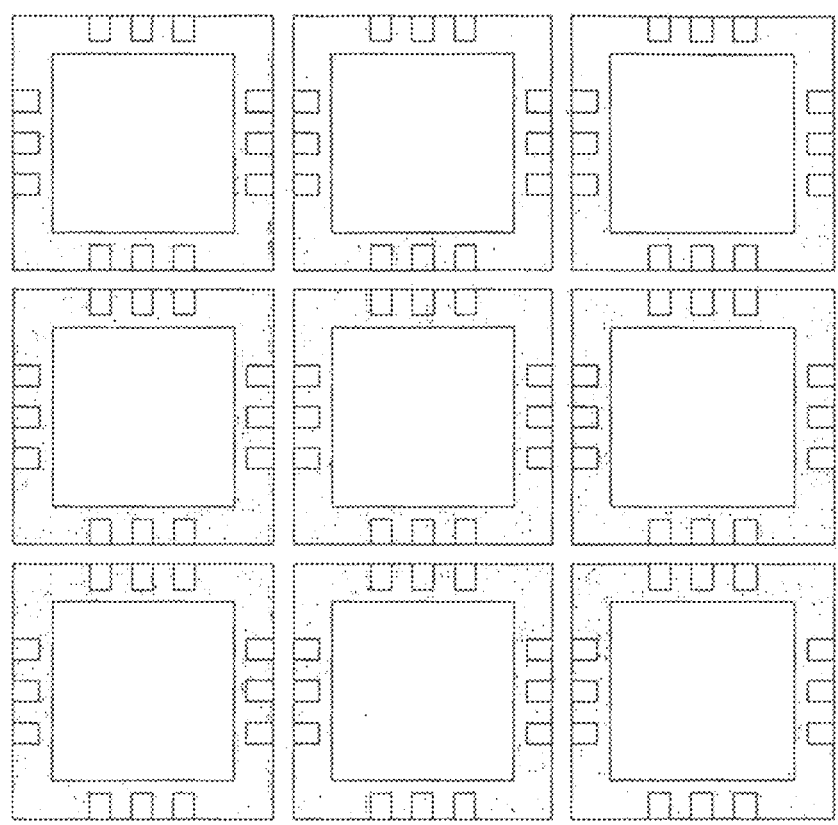
FIG. 12 depicts a plurality of leadless chip carriers following saw singulation according to an exemplary embodiment of the invention.

FIG. 12 depicts a plurality of leadless chip carriers following saw singulation according to an exemplary embodiment of the invention. Following the removal of the etch mask 230, and preferably following testing, the individual chip carriers may be separated from one another using saw singulation or a similar process.

FIGS. 13A through 18B depict a third preferred embodiment of the invention in which a finish 250 is applied to at least a top surface and a bottom surface of the leadframe prior to the application of a molding material 106.

Figure 13A:
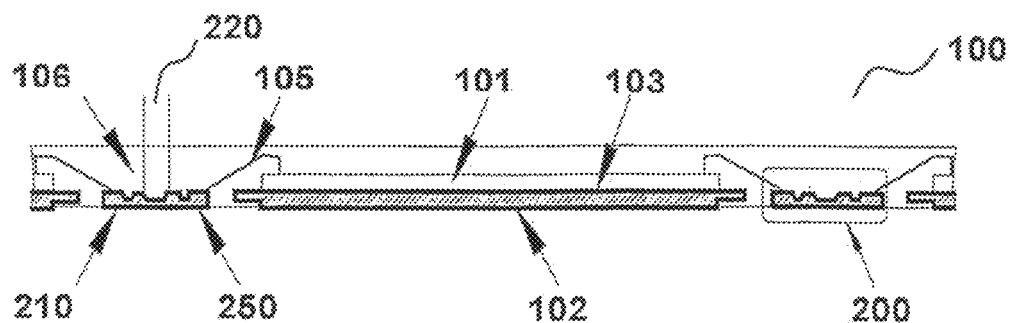
FIGS. 13A and 13B depict a leadless plastic chip carrier strip wherein at least a top and bottom surface of the leadframe are pre-plated with a finish, according to an exemplary embodiment of the invention.
Figure 13B:
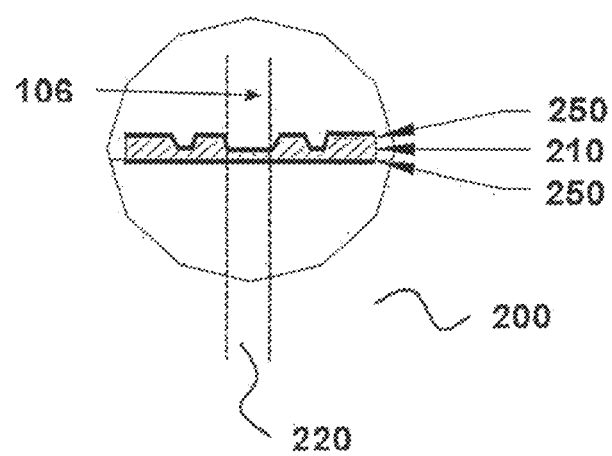

FIGS. 13A and 13B depict a leadless carrier strip wherein at least a top and bottom surface of the leadframe are pre-plated with a finish 250, according to an exemplary embodiment of the invention. It is understood that the pre-plated leadframe finish 250 may comprise a material consisting of at least one of NiPd (Nickel-Palladium) or NiPdAu (Nickel-Palladium-Gold). As shown in FIG. 13A the entire surface of the leadframe is pre-plated with a finish 250. This pre-plating technique is desirable in situations, for example, where a plating facility is not available after the carrier strip is assembled and covered with molding 106.

Figure 14A:
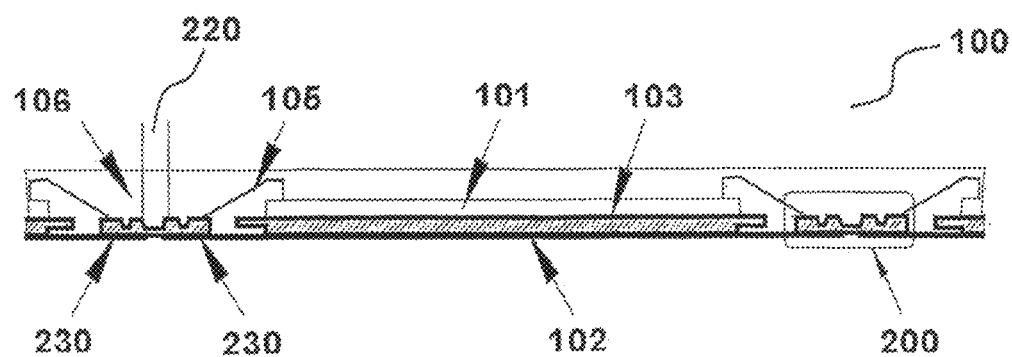
FIGS. 14A and 14B depict a leadless plastic chip carrier strip wherein an etch resist is patterned onto a finished surface of the leadframe, such that the finish in the dambar regions of the leadframe remains exposed, according to an exemplary embodiment of the invention.
Figure 14B:
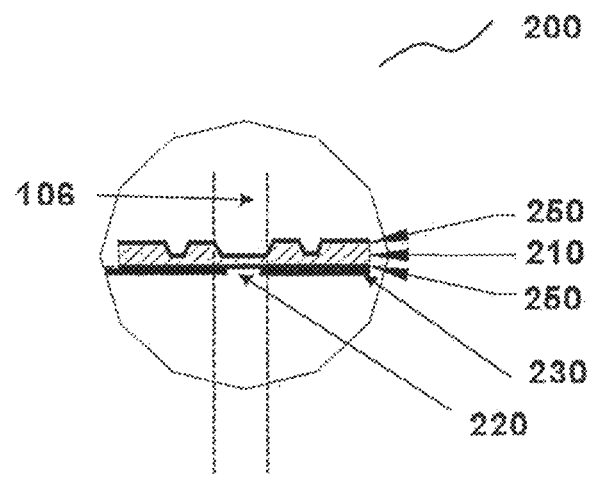

FIGS. 14A and 14B depict a leadless plastic chip carrier strip wherein an etch mask 230 is patterned onto a finished surface of the leadframe, such that the finish 250 in the dambar regions of the leadframe remains exposed, according to an exemplary embodiment of the invention. As shown in FIG. 14B, an etch mask 230 is applied to the bottom surface of the carrier strip in a manner similar to that described above, such that the pre-plated finish 250 in the dambar regions 220 remains exposed.

Figure 15A:
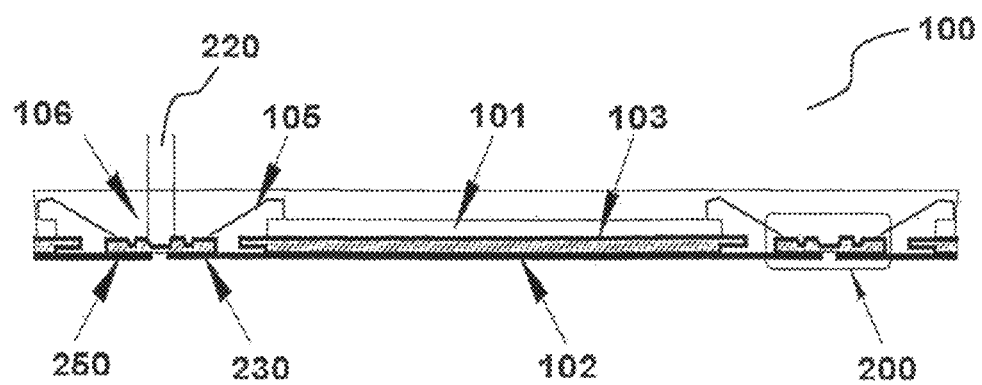
FIGS. 15A and 15B depict a leadless plastic chip carrier strip wherein the exposed finish in the dambar regions is removed, according to an exemplary embodiment of the invention.
Figure 15B:
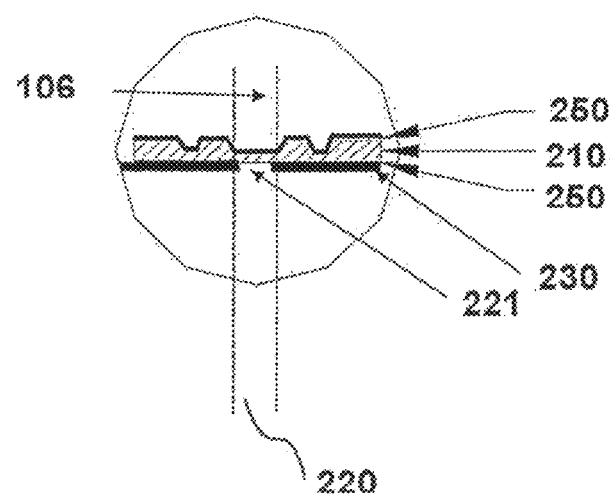

FIGS. 15A and 15B depict a leadless chip carrier strip wherein the exposed finish 250 in the dambar regions 220 is removed, according to an exemplary embodiment of the invention. As depicted in FIG. 15B, the finish 250 is removed from the dambar regions 220 such that a bottom surface 221 of the leadframe is exposed. The finish 250 may be removed using various known techniques such as dipping and high-pressure spray.

Figure 16A:
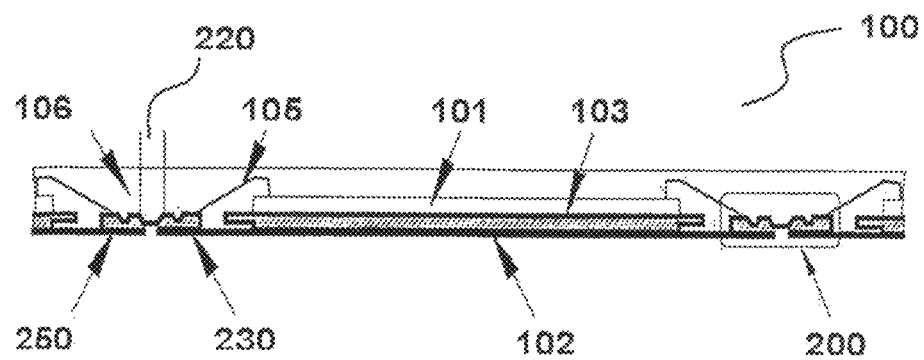
FIGS. 16A and 16B depict a leadless plastic chip carrier strip wherein the material of the leadframe in the dambar regions is etched away, according to an exemplary embodiment of the invention.
Figure 16B:
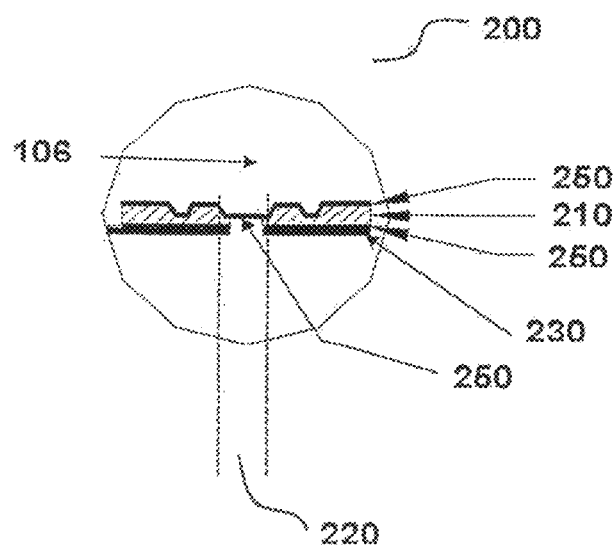

FIGS. 16A and 16B depict a leadless chip carrier strip wherein the material of the leadframe 221 in the dambar regions 220 is removed away, according to an exemplary embodiment of the invention. As shown in FIG. 16B, the leadframe material 221 in the dambar regions 220 is removed, such that an upper finish 250 is exposed. According to a preferred embodiment of the invention, the material is removed using an etching process.

Figure 17A:
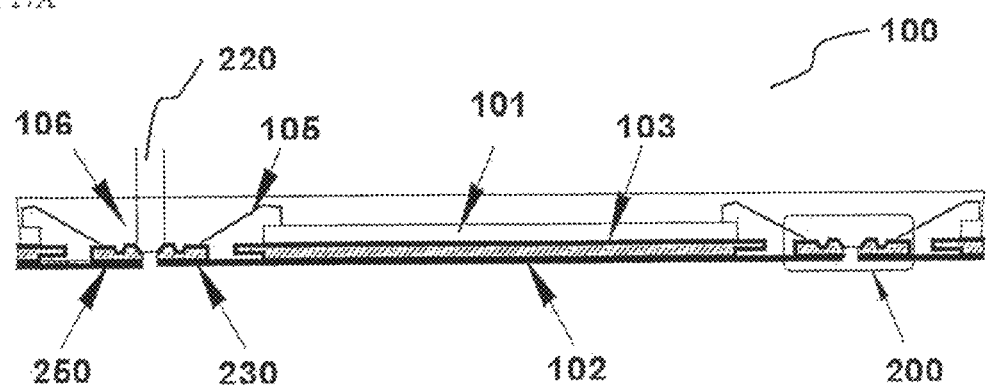
FIGS. 17A and 17B depict a leadless plastic chip carrier strip wherein the exposed top finish layer in the dambar regions is removed, according to an exemplary embodiment of the invention.
Figure 17B:
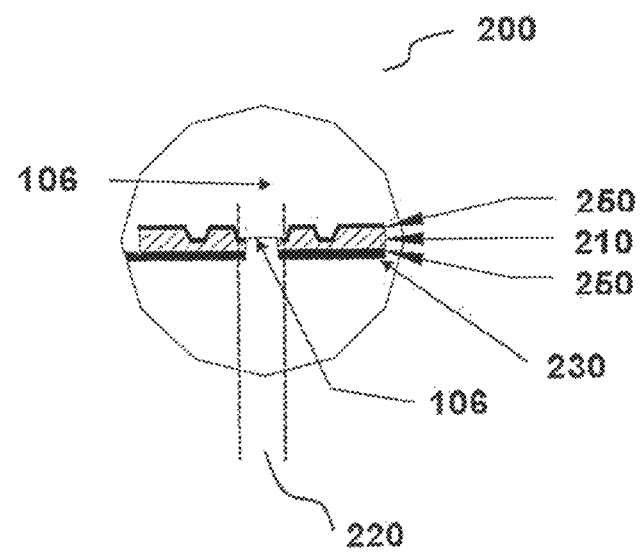

FIGS. 17A and 17B depict a leadless chip carrier strip wherein the exposed top finish layer 250 in the dambar regions 220 is removed, according to an exemplary embodiment of the invention. As shown in FIG. 17B, the upper finish layer 250 is then removed such that the molding material 106 is exposed, thereby electrically isolating the lead pads 210a and 210b as above.

Figure 18A:
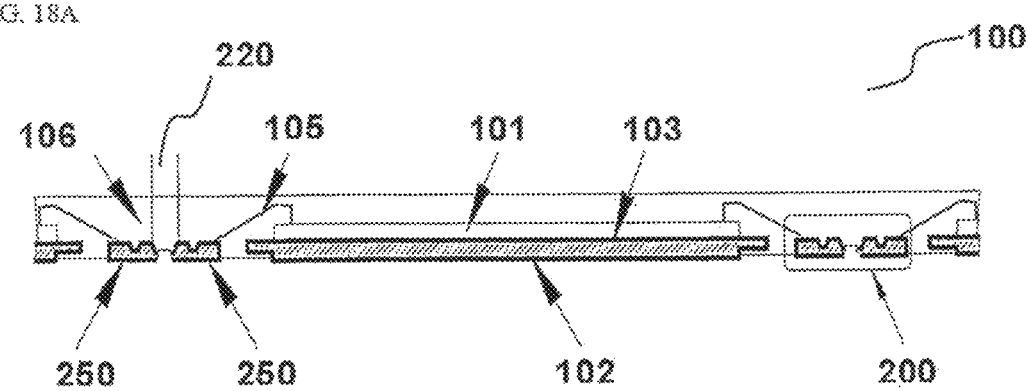
FIGS. 18A and 18B depict a leadless plastic chip carrier strip wherein the etch resist is removed from the carrier strip, according to an exemplary embodiment of the invention.
Figure 18B:
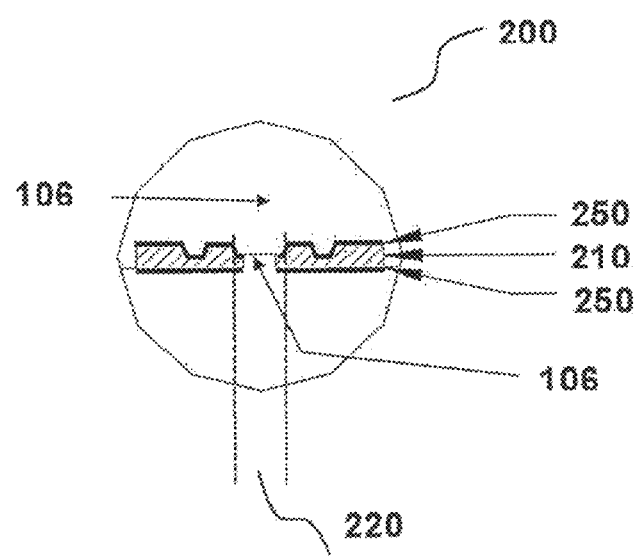

FIGS. 18A and 18B depict a leadless plastic chip carrier strip wherein the etch mask is removed from the carrier strip, according to an exemplary embodiment of the invention. As shown in FIG. 18B, the remaining etch mask is then removed such that the finish 250 is exposed. The individual carriers can then be tested in strip form prior to singulation.

Although the various exemplary embodiments have been fully described with reference to the accompanying drawings, it is to be noted that various changes and modifications will become apparent to those skilled in the art. Such changes and modifications are to be understood as being included within the scope of the subject matter defined by the appended claims.

We claim:

1. A method of forming a plurality of leadless chip carriers, the method comprising:
    forming a carrier strip comprising
        a plurality of die attach pads,
        a plurality of dice, respectively mounted to the die attach pads,
        a leadframe, wherein the leadframe at least partially encircles the die attach pads,
        interconnects, such as gold wires, to connect the die to respective terminals on the leadframe, and
        a molding, wherein the molding encapsulates an upper surface of the die attach pads, the dice, the interconnecting gold wires, and the leadframe;
    forming an etch mask on a portion of a bottom surface of the leadframe;
    forming a plating on a bottom surface of the die attach pads, the molding and a portion of the bottom surface of the leadframe where an etch mask is not formed;
    removing at least a portion of the etch mask from the bottom surface of the leadframe to expose a portion of the bottom side of the leadframe; and
    etching the leadframe such that a portion of a bottom surface of the molding is exposed.

2. The method of claim 1, further comprising singulating the leadless chip carriers.

3. The method of claim 2, wherein the singulating is saw singulating.

4. The method of claim 1, wherein the etch mask is formed at dambar regions of the leadframe.

5. The method of claim 1, wherein the leadframe consists of copper and the plating comprises a tin or tin lead material.

6. The method of claim 1, further comprising forming an internal plating on a top surface of the terminals on the leadframe, wherein the internal plating comprises at least one of Ag, NiAu and NiPd.

7. A method of forming a plurality of leadless chip carriers, the method comprising:
   forming a carrier strip comprising
      a plurality of die attach pads,
      a plurality of dice, respectively mounted to the die attach pads,
      a leadframe, wherein the leadframe at least partially encircles the die attach pads,
      interconnects, such as gold wires, to connect the die to respective terminals on the leadframe, and
      a molding, wherein the molding encapsulates an upper surface of the die attach pads, the dice, the interconnecting gold wires, and the leadframe;
   forming a plating on a bottom surface of the die attach pads, the molding and the leadframe;
   forming an etch mask on a portion of a bottom surface of the leadframe such that the etch mask is not formed at dambar regions of the leadframe;
   removing the plating at the dambar regions of the leadframe;
   etching the leadframe at the dambar regions of the leadframe such that a portion of a bottom surface of the molding is exposed; and
   removing the etch mask.

8. The method of claim 7, further comprising singulating the leadless chip carriers.

9. The method of claim 8, wherein the singulating is saw singulating.

10. The method of claim 7, wherein the leadframe consists of copper and the plating comprises a tin or tin lead material.

11. The method of claim 7, further comprising forming an internal plating on a top surface of the terminals on the leadframe, wherein the internal plating comprises at least one of Ag, NiAu and NiPd.

12. A method of forming a plurality of leadless chip carriers, the method comprising:
   forming a carrier strip comprising
      a plurality of die attach pads,
      a plurality of dice, respectively mounted to the die attach pads,
      a leadframe, wherein the leadframe at least partially encircles the die attach pads and the leadframe is plated with a finish,
      interconnects, such as gold wires, to connect the die to respective terminals on the leadframe, and
      a molding, wherein the molding encapsulates an upper surface of the die attach pads, the dice, the interconnecting gold wires and the leadframe;
   forming an etch mask on a portion of a bottom surface of the leadframe such that the etch mask is not formed at dambar regions of the leadframe;
   removing the finish at the dambar regions of the leadframe;
   etching the leadframe at the dambar regions of the leadframe such that a portion of an upper layer of the finish is exposed;
   removing the exposed portion of the finish such that a portion of a bottom surface of the molding is exposed; and
   removing the etch mask.

13. The method of claim 12, further comprising singulating the leadless chip carriers.

14. The method of claim 13, wherein the singulating is saw singulating.

15. The method of claim 12, wherein the etch mask is formed at dambar regions of the leadframe.

16. The method of claim 12, wherein the leadframe consists of copper.

17. The method of claim 12, wherein the leadframe plating comprises at least one of NiPd and NiPdAu.

18. A method of forming a plurality of leadless chip carriers, the method comprising:
   forming a chip carrier strip comprising a plurality of die attach pads,
      a plurality of dice respectively mounted to the die attach pads,
      a leadframe, wherein the leadframe includes dambar regions and lead pads and wherein the leadframe at least partially encircles the die attach pads,
      interconnects, wherein the interconnects connect each die of the plurality of dice to respective lead pads on the leadframe, and
      a molding, wherein the molding encapsulates an upper surface of the die attach pads, the dice, and the leadframe;
   performing an etching process to selectively remove portions of the leadframe corresponding to the dambar regions;
   wherein the etching, process to remove the portions of the leadframe directly exposes a portion of a bottom surface of the molding;
   and a singulation process to mechanically isolate individual chip carriers of the chip carrier strip.

19. The method of claim 18, wherein the individual chip carriers are electrically isolated from one another prior to the singulation process.

20. The method of claim 19, further comprising functionally testing the individual chip carriers prior to the singulation process.

* * * * *